(12) United States Patent
Nishikawa et al.

(10) Patent No.: US 10,304,754 B2
(45) Date of Patent: May 28, 2019

(54) HEAT DISSIPATION STRUCTURE OF SEMICONDUCTOR DEVICE

(71) Applicant: OMRON Corporation, Kyoto-shi, Kyoto (JP)

(72) Inventors: Takeo Nishikawa, Kyoto (JP); Takayoshi Tawaragi, Kitakatsuragi-gun (JP); Eiichi Omura, Nara (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/756,047

(22) PCT Filed: Jan. 25, 2017

(86) PCT No.: PCT/JP2017/002440
§ 371 (c)(1),
(2) Date: Feb. 27, 2018

(87) PCT Pub. No.: WO2017/179264
PCT Pub. Date: Oct. 19, 2017

(65) Prior Publication Data
US 2019/0027421 A1    Jan. 24, 2019

(30) Foreign Application Priority Data
Apr. 15, 2016   (JP) .................................. 2016-081963

(51) Int. Cl.
*H01L 23/34* (2006.01)
*H01L 23/40* (2006.01)
(Continued)

(52) U.S. Cl.
CPC .......... *H01L 23/4006* (2013.01); *H01L 23/36* (2013.01); *H01L 23/40* (2013.01);
(Continued)

(58) Field of Classification Search
CPC ...................................................... H01L 23/36
See application file for complete search history.

(56) References Cited

U.S. PATENT DOCUMENTS

2014/0262192 A1*  9/2014  Boday ................. H01L 23/3737
                                                            165/185

FOREIGN PATENT DOCUMENTS

JP      H05-183076 A     7/1993
JP      2000-311971 A    11/2000
(Continued)

OTHER PUBLICATIONS

Translation of JP-2007258448-A (Year: 2018).*
(Continued)

*Primary Examiner* — Thomas L Dickey
(74) *Attorney, Agent, or Firm* — Metrolexis Law Group, PLLC (57) ABSTRACT

A heat dissipation structure of a semiconductor device is provided, the semiconductor device including: an electrical bonding surface electrically connected to a substrate; and a heat dissipation surface as an opposite side of the electrical bonding surface. The heat dissipation surface makes contact with a heat spreader via a conductive TIM while the heat spreader makes contact with a heat sink via an insulating TIM. A surface of the heat spreader facing the semiconductor device includes a recess part formed in at least one part in a vicinity of an outer periphery of the semiconductor device.

2 Claims, 8 Drawing Sheets (51) Int. Cl.
  *H01L 23/36*   (2006.01)
  *H01L 23/498*   (2006.01)

(52) U.S. Cl.
  CPC .................. *H01L 23/49827* (2013.01); *H01L 2023/4018* (2013.01); *H01L 2023/4068* (2013.01); *H01L 2023/4087* (2013.01)

(56) References Cited

FOREIGN PATENT DOCUMENTS

| | | | |
|---|---|---|---|
| JP | 2006-147862 | A | 6/2006 |
| JP | 2007-258448 | A | 10/2007 |
| JP | 2007258448 | A * | 10/2007 |
| JP | 2008-300476 | A | 12/2008 |
| JP | 2009-283768 | A | 12/2009 |
| JP | 2014-241340 | A | 12/2014 |

OTHER PUBLICATIONS

English translation of the International Search Report of PCT/JP2017/002440 dated Apr. 4, 2017.
English translation of the Written Opinion of PCT/JP2017/002440 dated Apr. 4, 2017.
Extended European search report dated Apr. 3, 2019 in a counterpart European patent application No. 17782083.4.

* cited by examiner

| Item | Value |
|---|---|
| External Temperature | 25°C |
| Heat Generation Amount of Device | 30W |
| Insulating TIM 43 | 7W/deg·m, 0.3mmt |
| Heat Spreader 31 | Copper, 50 × 60 × 3mmt |
| Conductive TIM 33 | 40W/deg·m, 0.3mmt |
| Heat Sink 30A | Aluminum |

| Item | Value |
|---|---|
| External Temperature | 25°C |
| Heat Generation Amount of Device | 30W |
| Conductive TIM 33 | 40W/deg·m, 0.3mmt |
| Heat Spreader 31 | Copper, 50×60×3mmt |
| Insulating TIM 43 | 7W/deg·m, 0.3mmt |
| Heat Sink 30A | Aluminum |

HEAT DISSIPATION STRUCTURE OF SEMICONDUCTOR DEVICE

TECHNICAL FIELD

The present invention relates to a heat dissipation structure (also referred to as a cooling structure) of a surface mount semiconductor device (semiconductor device), and particularly relates to a heat dissipation structure with heat dissipation and insulation reliability, which can suitably be applied to a thin package semiconductor device.

BACKGROUND ART

Figure 7:
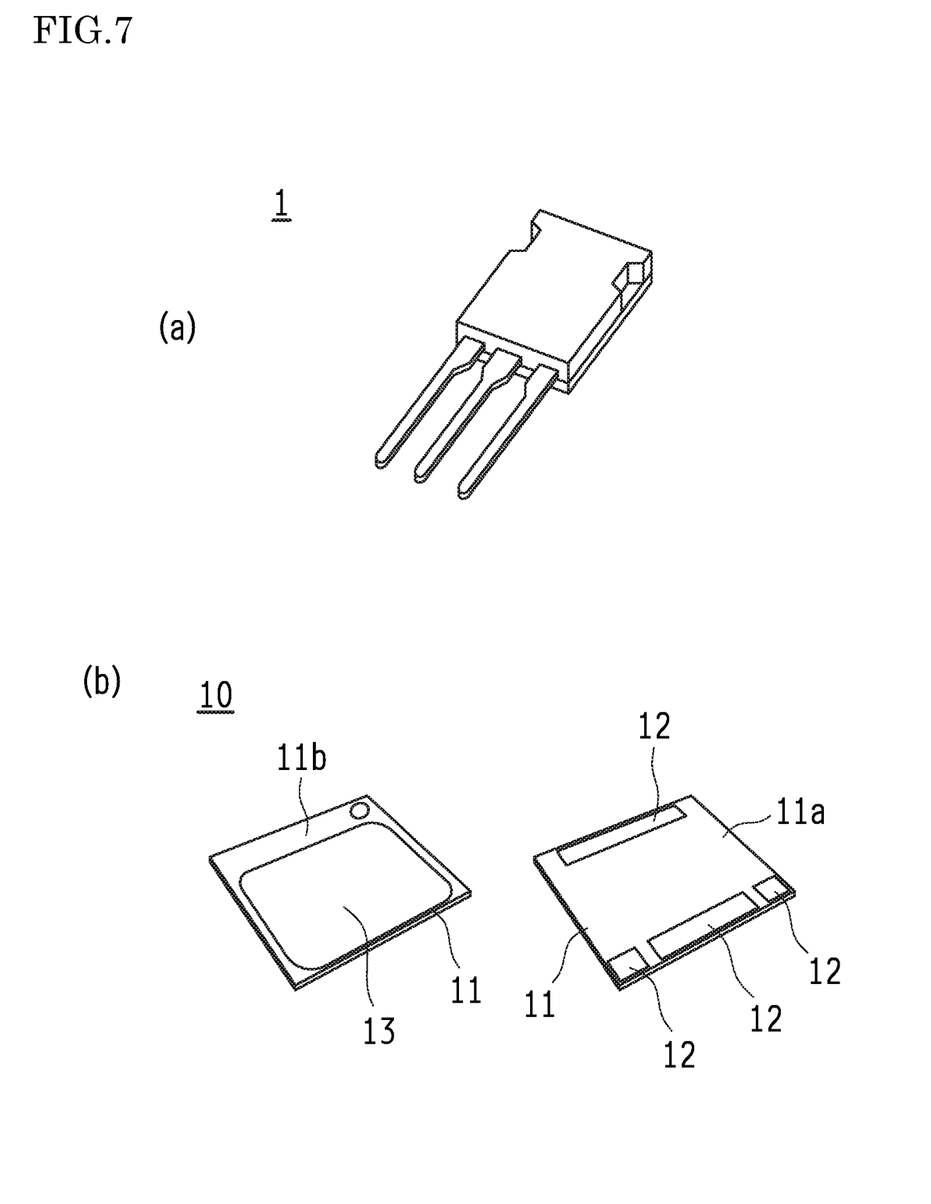
FIG. 7(a) is a schematic perspective view exemplarily showing a conventional lead type discrete component 1.
FIG. 7(b) is a schematic perspective view exemplarily showing a surface mount semiconductor device 10 that has recently been developed.

FIG. 7(a) is a schematic perspective view exemplarily showing a conventional lead type discrete component 1. FIG. 7(b) is a schematic perspective view exemplarily showing a surface mount semiconductor device 10 that has recently been developed.

In association with increasing an operational speed of a semiconductor switching device, it is necessary to reduce parasitic inductance of the device itself. Unlike the conventional discrete component 1 (for example, a lead type IGBT) as shown in FIG. 7(a), the semiconductor device 10 as shown in FIG. 7(b), for example, has a very high switching speed. Thus, thinning of its device package has progressed so as to realize the smallest possible parasitic inductance.

As shown in FIG. 7(b), such a semiconductor device 10 is housed in an ultra-thin package 11, and has, for example, an electrical bonding surface 11a and a heat dissipation surface 11b on the opposite side. On the electrical bonding surface 11a, at least one electrode (terminal) 12 that is electrically connected to a substrate is disposed. On the heat dissipation surface 11b, a large electrode 13 that also serves to dissipate heat is disposed. When the semiconductor device 10 is mounted, it is necessary to have an excellent heat dissipation as well as an excellent insulation reliability. For this purpose, techniques have been proposed as disclosed in, for example, Patent Documents 1 to 3.

PRIOR ART DOCUMENTS

Patent Documents

[Patent Document 1] JP 2006-147862 A
[Patent Document 2] JP 2014-241340 A
[Patent Document 3] JP 2000-311971 A

SUMMARY OF THE INVENTION

Problem to be Solved by the Invention

Figure 8:
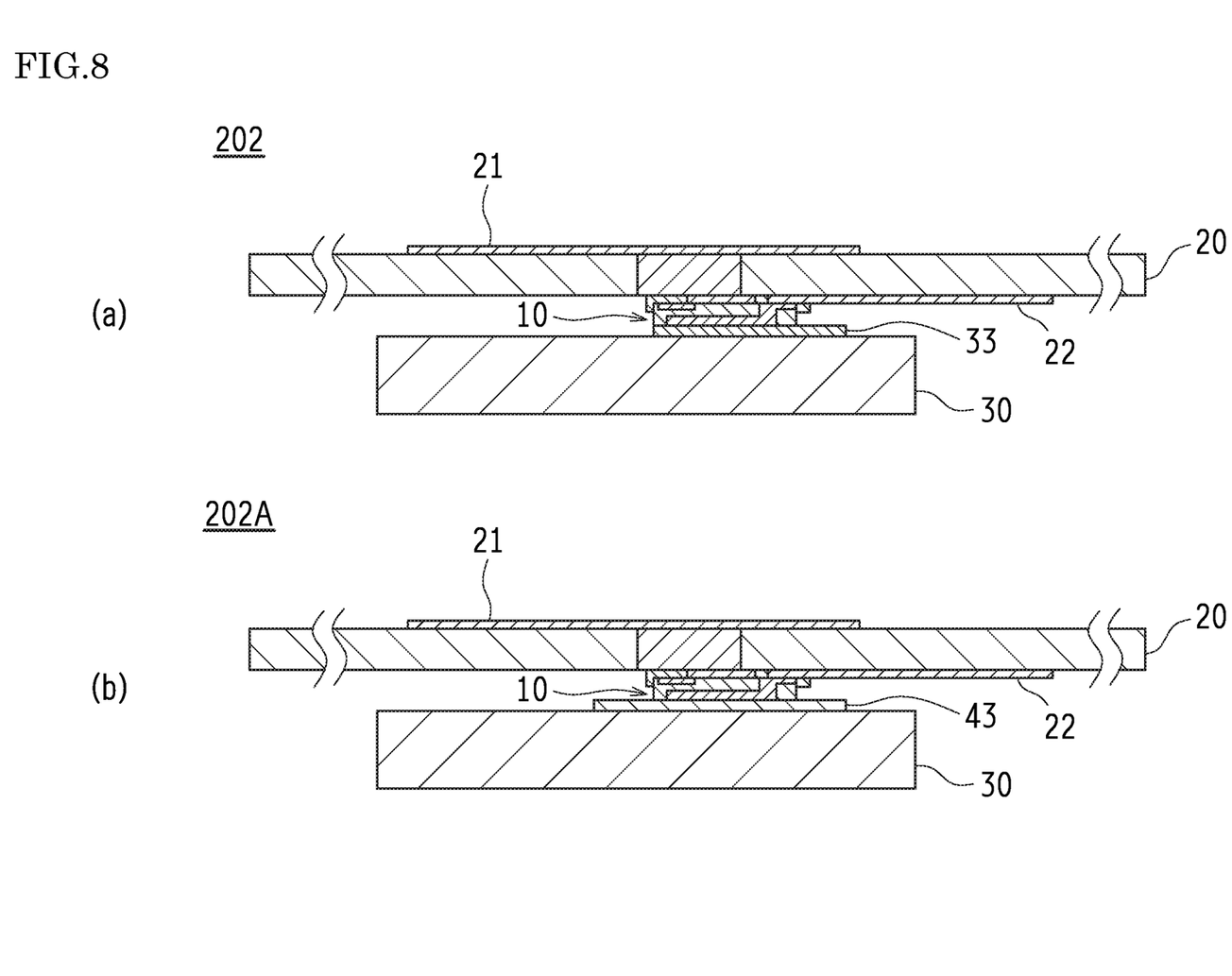
FIG. 8(a) is a cross-sectional view exemplarily and schematically showing another conventional heat dissipation structure 202.
FIG. 8(b) is a cross-sectional view exemplarily and schematically showing the heat dissipation structure 202A, which is a variation of the heat dissipation structure 202.

FIG. 8(a) is a cross-sectional view exemplarily and schematically showing a conventional heat dissipation structure 202. FIG. 8(b) is a cross-sectional view exemplarily and schematically showing a heat dissipation structure 202A, which is a variation of the heat dissipation structure 202.

In order to reduce device costs, each device is required to have the maximum possible capacity, which needs a structure that can efficiently dissipate generated heat. As an example, it is possible to consider that a heat sink 30 is directly connected to the semiconductor device 10.

Alternatively, as shown in the heat dissipation structure 202 in FIG. 8(a), the semiconductor device 10 may be connected to the heat sink 30 via a conductive TIM 33 (for example, 50 W/deg·m), which is an example of conductive thermal interface materials (TIM).

However, due to thinning of the package 11 of the semiconductor device 10, the distance between the electrodes 12 having different voltages is reduced, and the insulation distance may not be maintained depending on conditions of a conductive material such as solder, which may result in generation of electrical breakdown that damages the semiconductor device 10.

In order to avoid the above disadvantages, it is possible to interpose an insulating TIM 43 (for example, −10 W/deg·m) between the semiconductor device 10 and the heat sink 30 in place of the conductive TIM 33, as shown, for example, in the heat dissipation structure 202A in FIG. 8(b). With such a configuration, although generation of electrical breakdown can be avoided, the device cannot have a large capacity due to a low coefficient of thermal conductivity. For this reason, there needs to be increase in size and capacity of the semiconductor device 10, and/or parallel use of multiple semiconductor devices 10, which may increase overall cost.

In consideration of the above problems in the conventional art, an object of the present invention is to provide a heat dissipation structure of a semiconductor device with an excellent heat dissipation as well as an excellent insulation reliability that can be suitably applied to a thin type surface mount semiconductor device.

Means for Solving the Problem

In order to achieve the above object, in the present invention, a heat dissipation structure of a semiconductor device is provided. The semiconductor device includes: an electrical bonding surface electrically connected to a substrate; and a heat dissipation surface as an opposite side of the electrical bonding surface. The heat dissipation surface makes contact with a high-heat-transferring conductive member via a non-insulating member, and the high-heat-transferring conductive member makes contact with a heat dissipation component via an insulating member. A surface of the high-heat-transferring conductive member facing the semiconductor device includes a recess part formed in at least a part in a vicinity of an outer periphery of the semiconductor device.

With the above-described heat dissipation structure of a semiconductor device, heat generated by the semiconductor device is transmitted from the heat dissipation surface to the high-heat-transferring conductive member via the non-insulating member so as to be diffused, and further is transmitted to the heat dissipation component via the insulating member. Thus, the heat dissipation structure has an excellent heat dissipation. In addition, it is possible to avoid generation of electrical breakdown thanks to the recess part in a surface of the high-heat-transferring conductive member facing the semiconductor device, which is formed in the vicinity of the outer periphery of the semiconductor device.

In the heat dissipation structure of the semiconductor device of the present invention, the substrate may be fixed to the high-heat-transferring conductive member by a conductive fixing material (such as a screw) so that at least a part of a pattern on the substrate is conducted to the high-heat-transferring conductive member. Also, the substrate may be further fixed to the high-heat-transferring conductive member by an insulating fixing material (such as a screw).

With the above-described heat dissipation structure of the semiconductor device, it is possible to more reliably avoid generation of electrical breakdown, as well as to accurately position the components. When the substrate is fixed using also the insulating fixing material, the above positioning and fixing can be performed more accurately and reliably.

Effect of the Invention

With a heat dissipation structure of a semiconductor device of the present invention, heat generated by the semiconductor device is transmitted from a heat dissipation surface to a high-heat-transferring conductive member via a non-insulating member so as to be diffused, and further is transmitted to a heat dissipation component via an insulating member. Thus, the heat dissipation structure has an excellent heat dissipation. In addition, it is possible to avoid generation of electrical breakdown thanks to the recess part in a surface of the high-heat-transferring conductive member facing the semiconductor device, which is formed in the vicinity of the outer periphery of the semiconductor device.

MODES FOR CARRYING OUT THE INVENTION

Hereinafter, several embodiments of the present invention will be described with reference to the drawings.

First Embodiment

Figure 1:
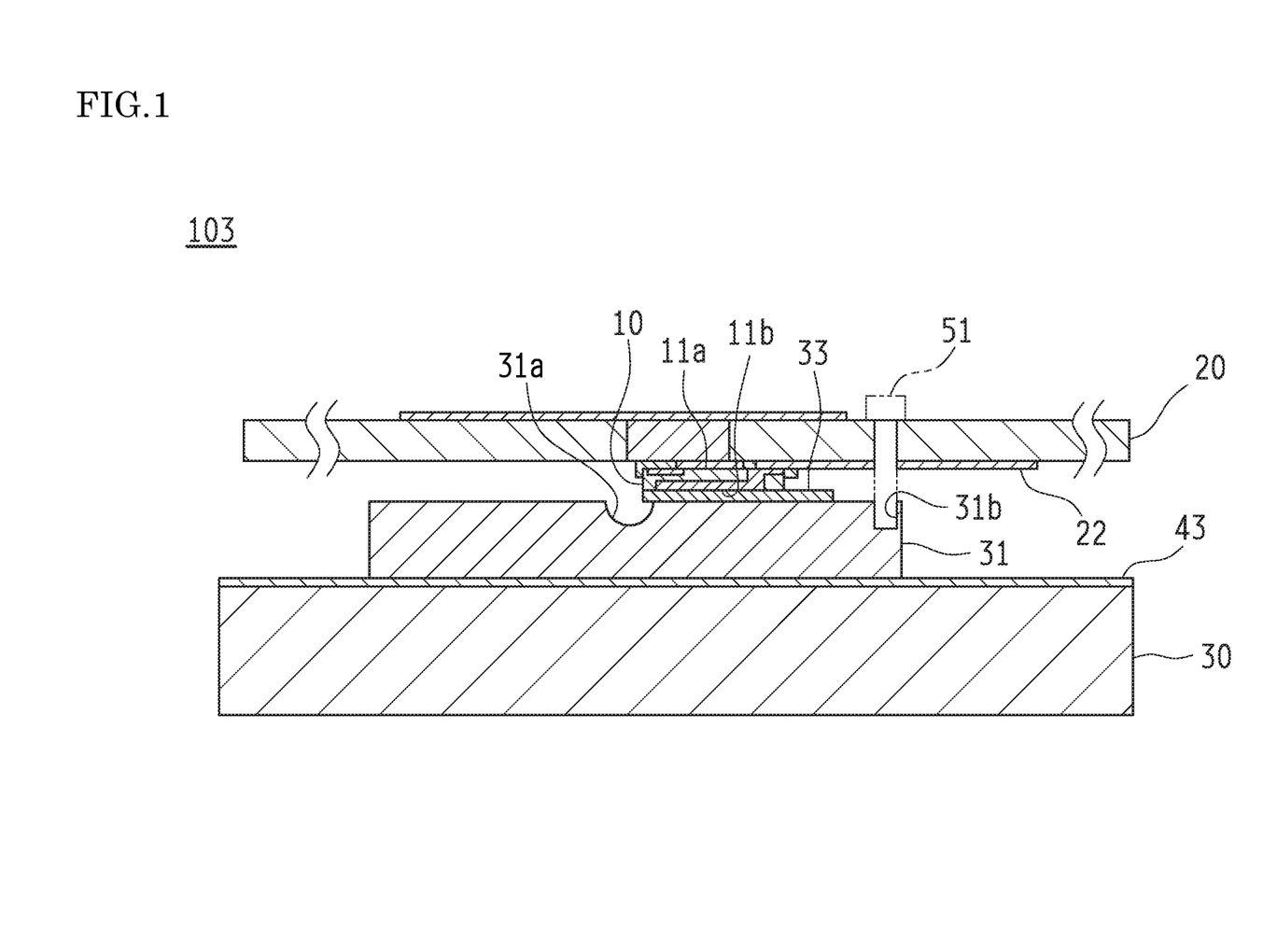
FIG. 1 is a cross-sectional view schematically showing a heat dissipation structure 103 according to a first embodiment of the present invention.

FIG. 1 is a cross-sectional view schematically showing a heat dissipation structure 103 according to a first embodiment of the present invention.

As shown in FIG. 1, in this heat dissipation structure 103, a heat spreader 31 as one example of non-insulating heat spreading elements is mounted on the heat sink 30 via an insulating TIM 43. On the heat spreader 31, a semiconductor device 10 is mounted via a conductive TIM 33, with a heat dissipation surface 11b of the semiconductor device 10 being a lower side. Electrodes 12 on an electrical bonding surface 11a of the semiconductor device 10 are electrically connected to a lower surface pattern 22 of a substrate 20 by soldering and the like.

Furthermore, in an upper surface of the heat spreader 31, a recess part 31a is formed near the outer periphery of the semiconductor device 10, and more specifically, in the vicinity of the electrodes 12 and the like that are electrically connected to the substrate 20 by soldering and the like (especially the electrodes 12 to which are applied potentials different from that is applied to the heat dissipation surface 11b). The recess part 31a has, for example, a groove shape along the outer periphery of the semiconductor device 10, and the internal surface of the groove is preferably formed as a shape substantially having an equal distance from any of the soldering positions.

With the above-described heat dissipation structure 103, it is possible to realize a high thermal conductivity by interposing the conductive TIM 33 between the semiconductor device 10 and the heat spreader 31. It is also possible to ensure a sufficient insulation distance between the soldering positions of the electrodes 12 and the like of the semiconductor device 10 and the upper surface of the heat spreader 31 that may have a voltage highly different from the soldering positions. Thus, both the high heat dissipation and the insulation reliability can be obtained by the low-cost structure, which results in overall cost reduction in a power converter and the like.

The resistance value of the conductive TIM 33 is not zero, but changes according to the temperature and/or the adhesion state. Thus, it is assumed that the resistance value changes during driving of the semiconductor device 10. As a result, the potential of the heat spreader 31 may become instable, which may lead to malfunction of or damage to the semiconductor device 10 due to generation of voltage noise or surge voltage.

Thus, a screw hole 31b may be formed in the heat spreader 31 so as to fix the substrate 20 to the heat spreader 31 by screwing a conductive screw 51 from the surface of the substrate 20.

In this way, the heat spreader 31 is electrically connected to the pattern on the substrate 20 (for example, the lower surface pattern 22) that should have the same potential as the heat spreader 31, so that the electrical stability is improved. Thus, it is possible to more reliably avoid electrical breakdown of the semiconductor device 10. Also, it is possible to accurately position the semiconductor device 10 bonded to the substrate 20 by soldering and the like and the recess part 31a in the heat spreader 31. Such a positioning is important to ensure a sufficient insulation distance.

Variation of First Embodiment

Figure 2:
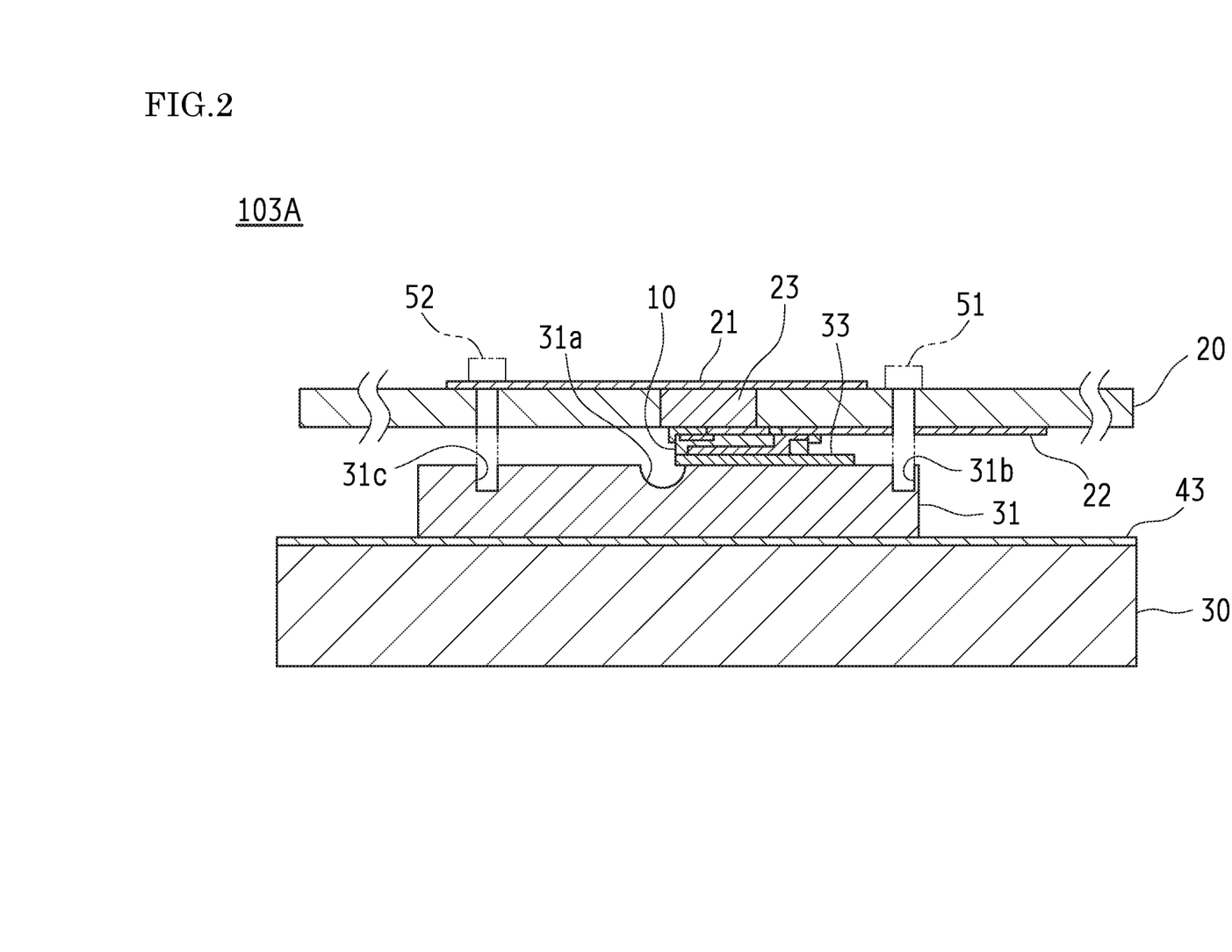
FIG. 2 is a cross-sectional view schematically showing a heat dissipation structure 103A according to a variation of the first embodiment of the present invention.

FIG. 2 is a cross-sectional view schematically showing a heat dissipation structure 103A of the semiconductor device 10 according to a variation of the first embodiment of the present invention. The common elements with the first embodiment are indicated by the same reference numerals, and hereinafter, a description will be given mainly on the configuration that differs from the configuration of the first embodiment.

In order to accurately position the semiconductor device 10 bonded to the substrate 20 by soldering and the like and the recess part 31a in the heat spreader 31, or to fix the substrate 20 to the heat spreader 31, there may be a case in which a part on the substrate 20 that should not be conducted to the heat spreader 31 (for example, an upper surface pattern 21 conducted to the electrode 12 of the semiconductor device 10 via a via hole 23) is required to be fixed to the heat spreader 31 by the screw.

In this case, as shown in FIG. 2, another screw hole 31c may be formed in the heat spreader 31 so as to fix the substrate 20 to the heat spreader 31 by screwing an insulating screw 52.

With the above-described heat dissipation structure 103A, it is possible to more reliably perform the positioning of the semiconductor device 10 and the recess part 31a, and the fixing of the substrate 20 to the heat spreader 31.

EXAMPLES

Figure 3:
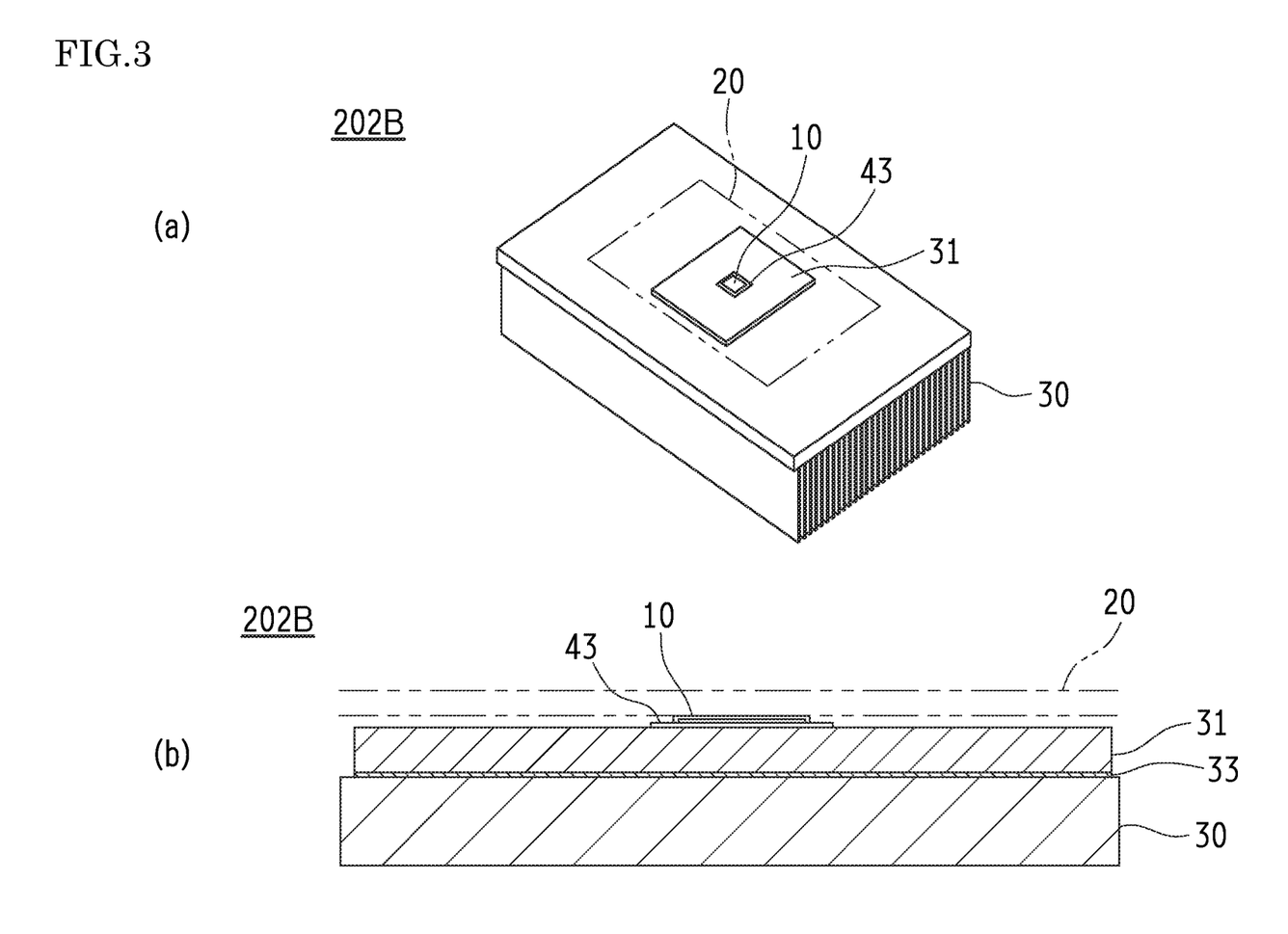
FIG. 3(a) is a perspective view schematically showing a heat dissipation structure 202B in which a conventional heat dissipation structure 202A is further mounted on a heat sink 30 via a conductive TIM 33.
FIG. 3(b) is a cross-sectional view thereof.
Figure 4:
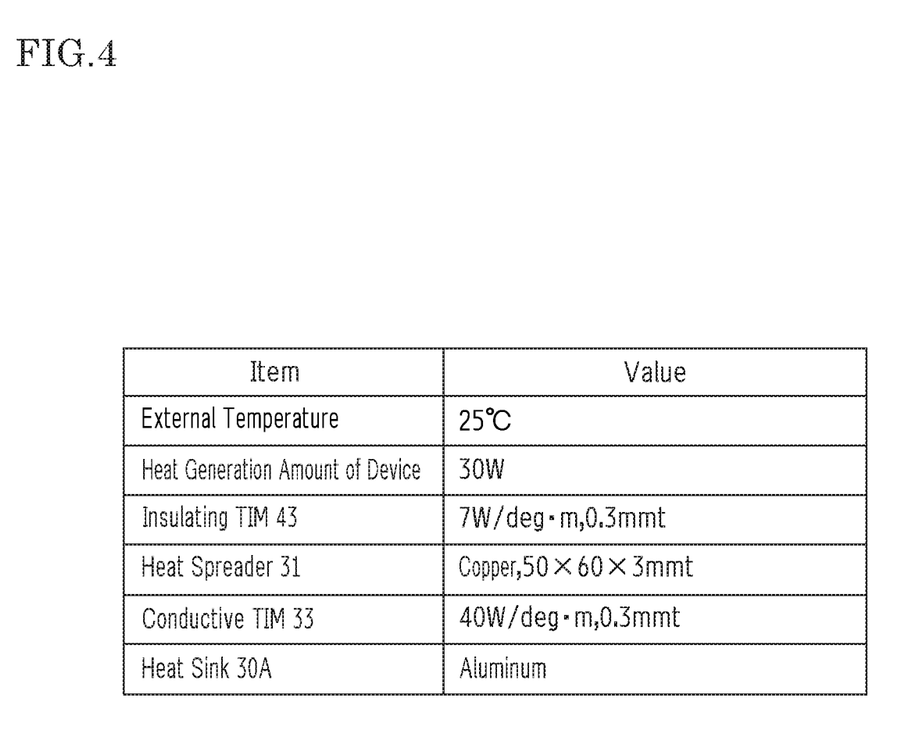
FIG. 4 is a table indicating detailed conditions of a thermal simulation performed in the heat dissipation structure 202B shown in FIGS. 3(a) and 3(b).

FIG. 3(a) is a perspective view schematically showing a heat dissipation structure 202B in which the conventional heat dissipation structure 202A is further mounted on the heat sink 30 via the conductive TIM 33. FIG. 3(b) is a cross-sectional view thereof. FIG. 4 is a table indicating detailed conditions of a thermal simulation performed in the heat dissipation structure 202B shown in FIGS. 3(a) and 3(b).

First, for the sake of comparison, the thermal simulation was performed in the heat dissipation structure 202B under conditions indicated in FIG. 4. In order to avoid electrical breakdown, the insulating TIM 43 (0.3 mmt) was interposed between the semiconductor device 10 and the heat spreader 31, and the conductive TIM 33 (0.3 mmt) was interposed between the heat spreader 31 and the heat sink 30.

By the cross-sectional temperature distribution in the steady state obtained by the thermal simulation, it was confirmed that the temperature increased up to 58° C. at a maximum due to heat generation from the semiconductor device 10 in the heat dissipation structure 202B.

Figure 5:
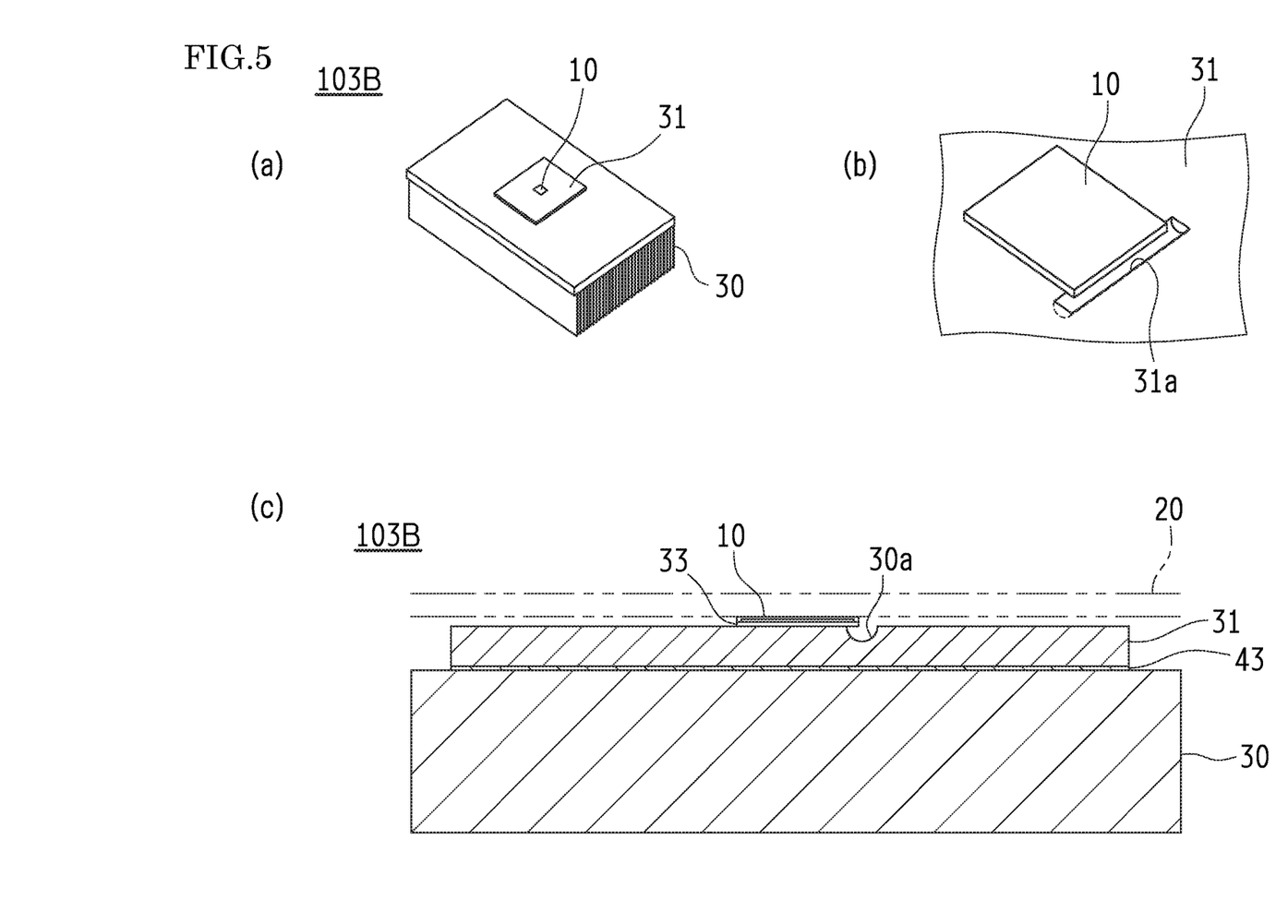
FIG. 5(a) is a cross-sectional view schematically showing a heat dissipation structure 103B largely similar to the heat dissipation structure 103 according to the first embodiment of the present invention.
FIG. 5(b) is a partially enlarged perspective view thereof.
FIG. 5(c) is a cross-sectional view thereof.
Figure 6:
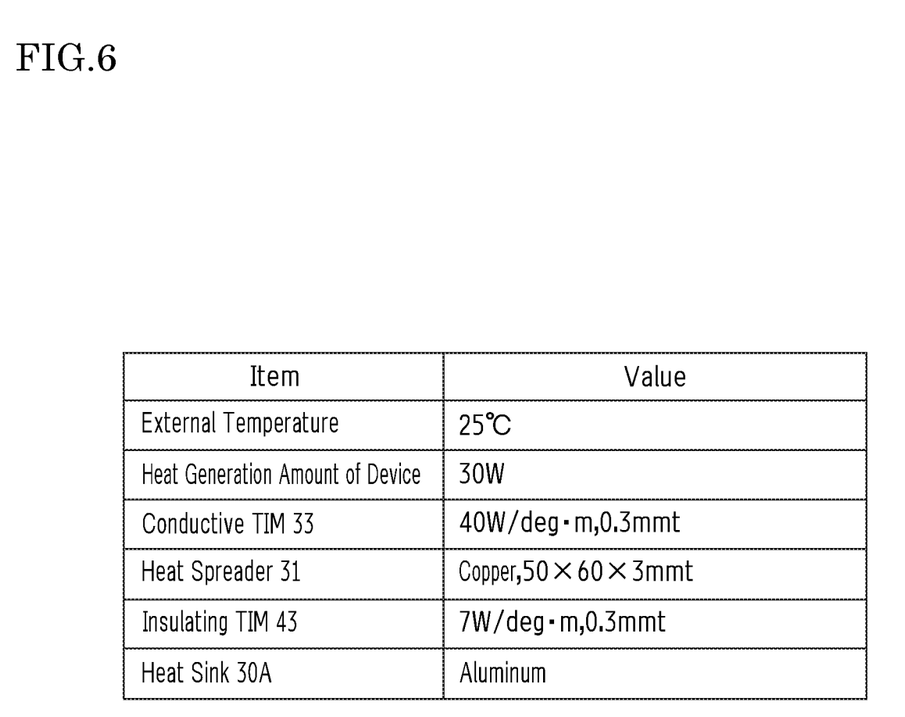
FIG. 6 is a table indicating detailed conditions of a thermal simulation performed in the heat dissipation structure 103B shown in FIGS. 5(a) to 5(c).

FIG. 5(a) is a cross-sectional view schematically showing a heat dissipation structure 103B largely similar to the heat dissipation structure 103 according to the first embodiment of the present invention. FIG. 5(b) is a partially enlarged perspective view thereof, and FIG. 5(c) is a cross-sectional view thereof. FIG. 6 is a table indicating detailed conditions of a thermal simulation performed in the heat dissipation structure 103B shown in FIGS. 5(a) to 5(c).

Second, as an example of the present invention, the thermal simulation was performed in the heat dissipation structure 103B under conditions indicated in FIG. 6. In the heat dissipation structure 103B, the recess part 31a is formed in a part of the heat spreader 31 that is close to one side of the semiconductor device 10. The semiconductor device 10 is connected to the heat spreader 31 via the conductive TIM 33 while the heat spreader 31 is connected to the heat sink 30 via the insulating TIM 43.

By the cross-sectional temperature distribution in the steady state obtained by the thermal simulation, it was confirmed that the temperature increased up to only 46° C. at a maximum due to heat generation from the semiconductor device 10 in the heat dissipation structure 103B. Thus, a large reduction in temperature (approximately 36% reduction in temperature increase) was confirmed.

Also, it was found that the recess part 31a formed in the heat spreader 31 exerts little or no adverse effect on thermal diffusion. Thus, it is possible to realize both heat dissipation and insulation reliability at low cost, by forming the recess part 31a in the heat spreader 31 so as to ensure insulation reliability and by interposing the conductive TIM 33 between the heat spreader 31 and the semiconductor device 10.

The respective configurations in the above-described embodiments and their variations may be combined with each other, provided that there is not any particular obstructive factor.

The present invention may be embodied in other forms without departing from the gist or essential characteristics thereof. Therefore, the embodiments described herein are to be considered in all respects as illustrative and not limiting. The technical scope of the present invention is indicated by the appended claims rather than by the foregoing embodiments, and all modifications and changes that come within the meaning and range of equivalency of the claims are intended to be embraced therein.

This application claims priority on Patent Application No. 2016-081963 filed in Japan on Apr. 15, 2016. The entire contents thereof are hereby incorporated in this application by reference. Also, the entire contents of the documents cited herein are hereby incorporated in this application by reference.

DESCRIPTION OF REFERENCE NUMERALS

10 Semiconductor device
11 Package
12 Electrode
13 Electrode
20 Substrate
30 Heat sink
31 Heat spreader
33 Conductive TIM
43 Insulating TIM
51 Conductive screw
52 Insulating screw

The invention claimed is:

1. A heat dissipation structure of a semiconductor device, the semiconductor device comprising: an electrical bonding surface electrically connected to a substrate; and a heat dissipation surface as an opposite side of the electrical bonding surface,
wherein the heat dissipation surface makes contact with a high-heat-transferring conductive member via a non-insulating member,
wherein the high-heat-transferring conductive member makes contact with a heat dissipation component via an insulating member,
wherein a surface of the high-heat-transferring conductive member facing the semiconductor device includes a recess part formed in at least a part in a vicinity of an outer periphery of the semiconductor device, and
wherein the substrate is fixed to the high-heat-transferring conductive member by a conductive fixing material such that at least a part of a pattern on the substrate is conducted to the high-heat-transferring conductive member through the conductive fixing material.

2. The heat dissipation structure of a semiconductor device according to claim 1,
wherein the substrate is further fixed to the high-heat-transferring conductive member by an insulating fixing material.

* * * * *